United States Patent
Kitahara

(10) Patent No.: US 7,145,202 B2
(45) Date of Patent: Dec. 5, 2006

(54) SEMICONDUCTOR DEVICE AND METHOD FOR MANUFACTURING THE SAME

(75) Inventor: Akinao Kitahara, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/778,496

(22) Filed: Feb. 13, 2004

(65) Prior Publication Data
US 2004/0159893 A1 Aug. 19, 2004

(30) Foreign Application Priority Data
Feb. 14, 2003 (JP) ............................. 2003-036292

(51) Int. Cl.
*H01L 29/76* (2006.01)
*H01L 29/94* (2006.01)
(52) U.S. Cl. ................. 257/336; 257/344; 257/327; 257/335; 257/374
(58) Field of Classification Search ............... 257/336, 257/344, 335, 327, 374
See application file for complete search history.

(56) References Cited
U.S. PATENT DOCUMENTS
5,705,840 A * 1/1998 Shen et al. ................. 257/344
5,929,483 A * 7/1999 Kim et al. .................. 257/336
6,566,216 B1 * 5/2003 Takahashi ................... 438/306
2004/0033646 A1 * 2/2004 Tang et al. .................. 438/142

OTHER PUBLICATIONS
Patent Abstracts of Japan, Publication No. 2000-012837, Publication date Jan. 14, 2000.

* cited by examiner

*Primary Examiner*—Douglas W. Owens
*Assistant Examiner*—Samuel A Gebremariam
(74) *Attorney, Agent, or Firm*—Fish & Richardson P.C.

(57) ABSTRACT

A semiconductor device including a source region and a drain region spaced from each other by a predetermined interval and formed on a main surface of a semiconductor substrate. A gate electrode is formed on the semiconductor substrate. A trench is filled with insulation material and formed in the main surface of the semiconductor substrate between a location under the gate electrode and at least one of the source region and the drain region with a predetermined depth. An LDD is formed along the trench and has an impurity concentration that is lower than that of the source region and the drain region.

5 Claims, 6 Drawing Sheets

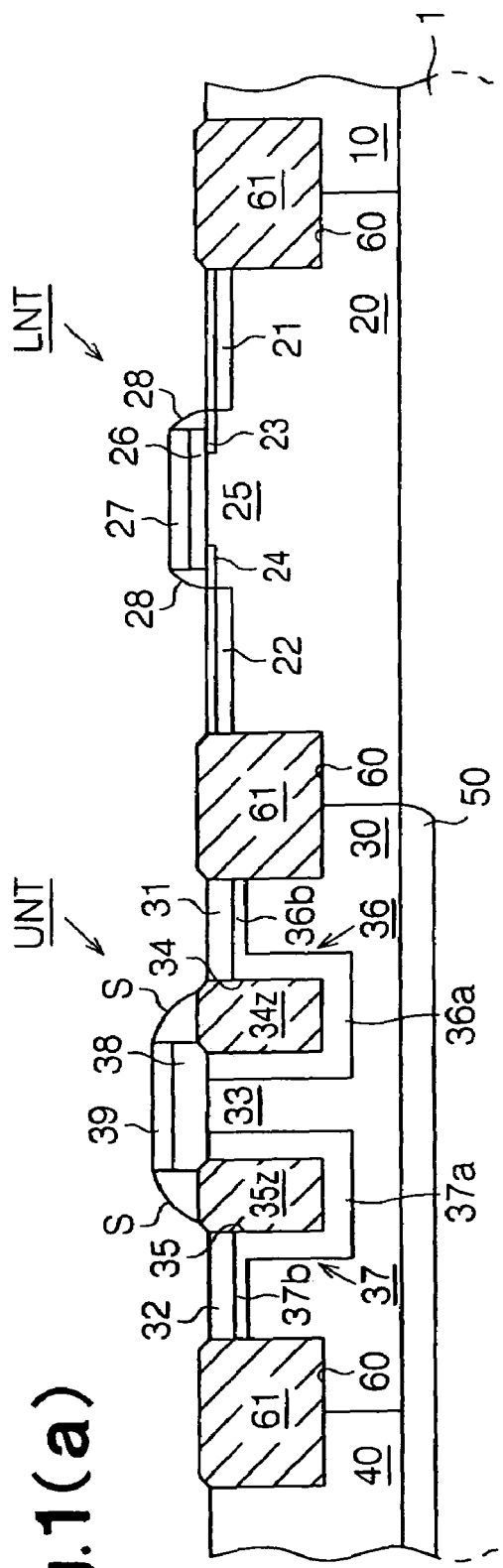
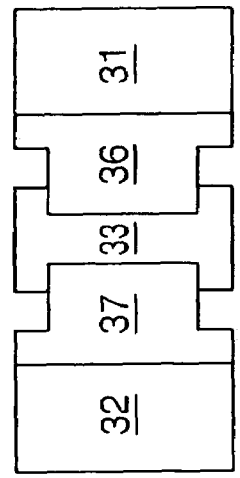

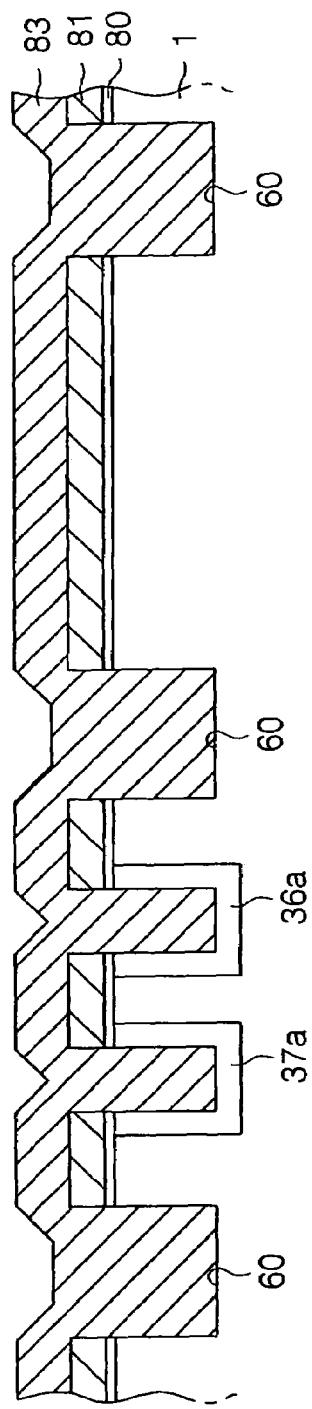
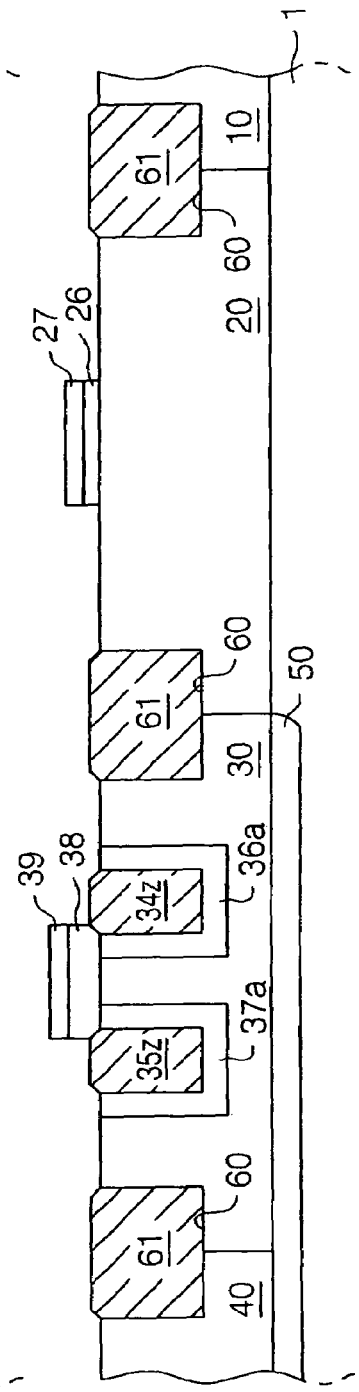
Fig.3(a) Fig.3(b) Fig.3(c)

SEMICONDUCTOR DEVICE AND METHOD FOR MANUFACTURING THE SAME

BACKGROUND OF THE INVENTION

The present invention relates to a semiconductor device having a lightly doped drain (LDD) region (low concentration diffusion region) and a method for manufacturing the same.

In recent years, the demand for high integration of semiconductor devices has increased greatly. Under these conditions, there has been an increasing demand for forming a plurality of transistors having different voltage capacity characteristics on the same semiconductor substrate. The formation of the plurality of transistors having different voltage capacities on the same semiconductor substrate enables adjustment of the gate length or the concentration of implanted impurity to the source region and drain region for each transistor.

When forming transistors by such adjustment, the device size tends to increase. For example, when low concentration impurity is implanted to the semiconductor substrate to form an LDD region for a transistor having normal voltage capacity after forming a transistor having a higher voltage capacity, the impurity may also be implanted into the drain region and source region of the high voltage transistor. The implanting of the impurity into the drain region and source region of the high voltage transistor tends to decrease the junction voltage capacity between the impurity implanted in the high voltage transistor and the well in which the high voltage resistant transistor is formed. In such a case, the gate length must be set longer so as to impart the desired voltage capacity characteristics to the high voltage transistor.

When transistors having various voltage capacities characteristics are formed on the same semiconductor substrate in this way, it becomes difficult to satisfy the requirement for miniaturization of the semiconductor device since the device size of the high voltage transistor tends to increase.

It has been proposed in the prior art, for example, as described in Japanese Patent No. 3125752, to form a high voltage transistor using shallow trench isolation (STI) technology by forming trenches under opposite sides of a gate and implanting insulation material in the trenches so as to form a source region and a drain region. By forming the high voltage transistor in this manner, the insulation material that fills the trenches functions as a mask. Thus, it is possible, when forming the LDD region of a transistor having normal voltage capacity, to avoid implanting impurity into the well in which the high voltage transistor is formed. Accordingly, the gate length of the high voltage transistor may be reduced, and the semiconductor device may be miniaturized.

The high voltage transistor of Japanese Patent No. 3125752 requires the impurity concentration of the source region and drain region to be decreased in order to maintain the capability of the transistor, such as the voltage capacity between the source region and the drain region during operation, at a desired level. However, when the impurity concentration of the source region and the drain region is low, the resistance of the source region and the drain region increases. This affects the operating speed of the transistor.

SUMMARY OF THE INVENTION

It is an object of the present invention to provide a semiconductor device and a method for manufacturing the same that are capable of maintaining the capacity of the transistor at a desired level while preventing the resistance from increasing.

To achieve the above object, the present invention provides a semiconductor device including a semiconductor substrate having a main surface. A source region and a drain region are formed on the main surface of the semiconductor substrate and spaced from each other by a predetermined interval. A gate electrode is formed on the semiconductor substrate. A trench is filled with insulation material and formed with a predetermined depth in the main surface of the semiconductor substrate between a location under the gate electrode and at least one of the source region and the drain region. An LDD is formed along the trench and has an impurity concentration that is lower than that of the source region and the drain region.

A further aspect of the present invention is a method for manufacturing a semiconductor device having a main surface and a source region and drain region spaced from each other by a predetermined interval formed on the main surface and including an LDD formed in correspondence with the source region and the drain region. The method includes forming a trench having a predetermined depth adjacent to at least one of the source region and drain region on the main surface of the semiconductor substrate, implanting an impurity in the trench to form the LDD along the trench, filling the trench with an insulation material, forming a gate electrode by deposing a gate insulating film on the semiconductor substrate, and implanting an impurity in higher concentration in the source region and the drain region.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 1(a), 1(b), and 1(c) are views showing the structure of a semiconductor device according to a first embodiment of the of the present invention;

FIGS. 3(a), 3(b), and 3(c) are cross sectional views showing the manufacturing process for the semiconductor device of FIG. 1;

DETAILED DESCRIPTION OF THE PREFERRED EMBODIMENTS

Figure 2A:
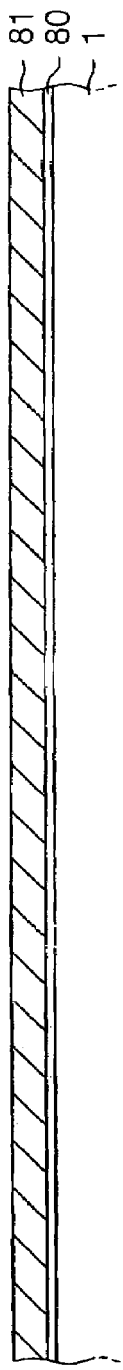
FIGS. 2(a), 2(b), and 2(c) are cross sectional views showing the manufacturing process for the semiconductor device of FIG. 1.

A semiconductor device according to a first embodiment of the present invention will now be described with reference to the drawings.

The cross sectional structure of the semiconductor device in the first embodiment is shown in FIG. 1(a). The semiconductor device of the first embodiment includes a normal voltage transistor and a high voltage transistor, which has a higher voltage capacity. Normal voltage is assumed to be a drive voltage of, for example, 1.0 to 5.5 V, and high voltage is assumed to be a high drive voltage of, for example, 10 to 30 V. Furthermore, the normal voltage transistor and the high voltage transistor are both complementary type transistors (CMOS).

The semiconductor device of the first embodiment has a triple well configuration so as to form P channel and N channel normal voltage transistors and P channel and N channel high voltage transistors. That is, an N well 10 and a P well 20, which are used to form a normal voltage transistor, and a P well 30 and an N well 40, which are used to form a high voltage transistor, are formed on the main surface of a P-type semiconductor substrate 1. An N-type N-type deep well 50 is formed so as to include the P well 30 and N well 40, which form the high voltage transistor. These wells are well-shaped diffusion regions, which are conductive and may be either of the P-type or the N-type, formed in the semiconductor substrate.

It is preferable that the impurity concentration of the P well 20 (i.e., the number of impurity atoms per unit volume) be, for example, $1 \times 10^{17}$ to $5 \times 10^{18}$ cm$^{-3}$ and that the impurity concentration of the N well 10 be, for example, $1 \times 10^{17}$ to $5 \times 10^{18}$ cm$^{-3}$. Furthermore, it is preferred that the impurity concentration of the P well 30 be, for example, $5 \times 10^{16}$ to $5 \times 10^{18}$ cm$^{-3}$ and that the impurity concentration of the N well 40 be, for example, $5 \times 10^{16}$ to $1 \times 10^{17}$ cm$^{-3}$. It is preferred that the impurity concentration of the N-type deep well 50 be, for example, $1 \times 10^{16}$ to $1 \times 10^{17}$ cm$^{-3}$. The impurity concentrations of the P well 30 and the N well 40 are greater than the impurity concentration of the N-type deep well 50. When the depth of the N-type deep well 50 is, for example, 2 to 4 μm, it is preferred that the depths of the P wells 20 and 30 and the N wells 10 and 40 be, for example, 1 to 3 μm. The depths of the P wells 20 and 30 and the N wells 10 and 40 are less than the depth of the N-type deep well 50.

Semiconductor devices are formed in the surface areas of the each of the P wells 20 and 30 and N wells 10 and 40. Device partitioning trenches 60 are formed to partition each semiconductor element, and a device insulating film 61 fills each device partitioning trench 60. Among normal voltage transistors and high voltage transistors, FIG. 1(a) shows an N channel normal voltage transistor LNT and an N channel high voltage transistor UNT. A P-type normal voltage transistor and a P-type high voltage transistor are not shown for the sake of convenience of the description.

Normal voltage transistors will now be described using the N channel normal voltage transistor LNT as an example. A drain region 22 and a source region 21 having an N-type conduction are formed in the surface region of the P well 20. Further, LDD regions 23 and 24 having a conduction type that is the same as that of the source region 21 and drain region 22 are formed in the P well 20. The impurity concentration of the LDD regions 23 and 24 is lower than that of the source region 21 and the drain region 22. A gate insulating film 26 and a gate electrode 27 are formed above a channel 25, which is formed between the source region 21 and drain region 22. Spacers 28 are formed on the side walls of the gate insulating film 26 and the gate electrode 27. The top surfaces of the source region 21, the drain region 22, and gate electrode 27 are silicided.

The impurity concentration of the source region 21 and drain region 22 of the N channel normal voltage transistor LNT is preferably, for example, $5 \times 10^{18}$ to $5 \times 10^{20}$ cm$^{-3}$. Furthermore, the impurity concentration of the LDD regions 23 and 24 is preferably, for example, $1 \times 10^{17}$ to $1 \times 10^{19}$ atoms/cm$^3$.

Furthermore, the impurity concentration of a source region and a drain region for a P channel normal voltage transistor (not shown) is preferably $1 \times 10^{18}$ to $1 \times 10^{20}$ atoms/cm$^3$. Moreover, the impurity concentration of an LDD region for the P channel normal voltage transistor is preferably, for example, $1 \times 10^{17}$ to $1 \times 10^{19}$ atoms/cm$^3$.

The impurity concentrations of each source region, drain region, and LDD region are greater than the impurity concentrations of the well in which they are formed.

The high voltage transistor will now be described using the N channel high voltage transistor UNT as an example. That is, a trench 34 is formed between the source region 31 and channel 33 of the N channel high voltage transistor UNT in the P well 30, and an insulation material 34z fills the trench 34. A trench 35 is formed between the drain region 32 and the channel 33 of the N channel high voltage transistor UNT in the P well 30, and an insulation material 35z fills the trench 35.

An LDD region 36, which has an impurity concentration lower than that of the source region 21, is formed along the trench 34 from the channel 33 to the source region 31 in the P well 30. The LDD region 36 includes a first section 36a, which extends along the trench 34, and a second section 36b, which is located below the source region 31. Furthermore, an LDD region 37, which has an impurity concentration lower than that of the drain region 32, is formed along the trench 35 from the channel 33 to the drain region 32. The LDD region 37 includes a first section 37a, which extends along the trench 35, and a second section 37b, which is located below the drain region 32.

Due to the LDD regions 36 and 37, the voltage capacity between the source region 31 and the drain region 32 is maintained at a sufficient level during operation. Moreover, since the LDD regions 36 and 37 are connected to the higher concentration source region 31 and drain region 32, the resistances are reduced. This maintains the operating speed of the transistor at an appropriate value.

The bottom surface of the source region 31 is covered by the LDD region 36, and the side surfaces of the source region 31 are covered by the insulation material 34z and the device insulating film 61. Further, the bottom surface of the drain region 32 is covered by the LDD region 37, and the side surfaces of the drain region 32 are covered by the insulation material 35z and the device insulating film 61. This increases the junction voltage capacity of the source region 31 and P well 30 and the junction voltage capacity of the drain region 32 and P well 30. That is, the side surfaces of the source region 31 and drain region 32 prevent an electrical junction (coupling) with the P well 30 by means of the insulation materials 34z and 35z and the device insulating film 61. Furthermore, since the bottom surfaces of the source region 31 and the drain 32 contact the LDD regions 36 and 37, the slope of the impurity concentration between the source region 31 and drain region 32 and the P well 30 is decreased. This increases the junction voltage capacity between the source region 31 and drain region 32 and the P well 30.

A gate insulating film 38 and gate electrode 39 are formed above the channel 33. Spacers S are formed at the side walls of the gate insulating film 38 and the gate electrode 39.

Furthermore, the top surfaces of the source region 31, drain region 32, and gate electrode 39 are silicided.

The impurity concentration of the source region 31 and the drain region 32 of the N channel high voltage transistor UNT is preferably, for example, $5\times10^{18}$ to $5\times10^{20}$ atoms/cm$^3$, and the impurity concentration of the LDD regions 36 and 37 is preferably, for example, $2\times10^{17}$ to $2\times10^{19}$ atoms/cm$^3$.

Furthermore, the impurity concentration of the source region and drain region of a P channel high voltage transistor not shown in the drawing is preferably $1\times10^{18}$ to $1\times10^{20}$ atoms/cm$^3$, and the impurity concentration of the LDD regions is preferably, for example, $2\times10^{17}$ to $2\times10^{19}$ atoms/cm$^3$.

The impurity concentrations of each source region, drain region, and LDD region are greater than the impurity concentrations of the well in which they are formed.

FIG. 1(b) is a top plan view of the N channel high voltage transistor UNT and is a view obtained by projecting the source region 31, the drain region 32, the channel 33, and the LDD regions 36 and 37 from top to bottom. As shown in FIG. 1(b), the LDD region 36 is formed so as to have a width (dimension in the lateral direction of the channel) that decreases at positions closer to the channel 33 than at positions closer to the source region 31. That is, the width is decreased in a stepped manner from the source region 31 to the channel 33 below the trench 34. In the same manner, the LDD region 37 is formed such that its width is decreased at positions closer to the channel 33 than at positions closer to the drain region 32, and the width is decreased in a stepped manner below the trench 35.

In comparison, the LDD regions 23 and 24 have widths that do not change in the normal voltage transistor LNT shown in FIG. 1(c).

A process for manufacturing this semiconductor device will now be described with reference to FIGS. 2 through 4.

Figure 2B:
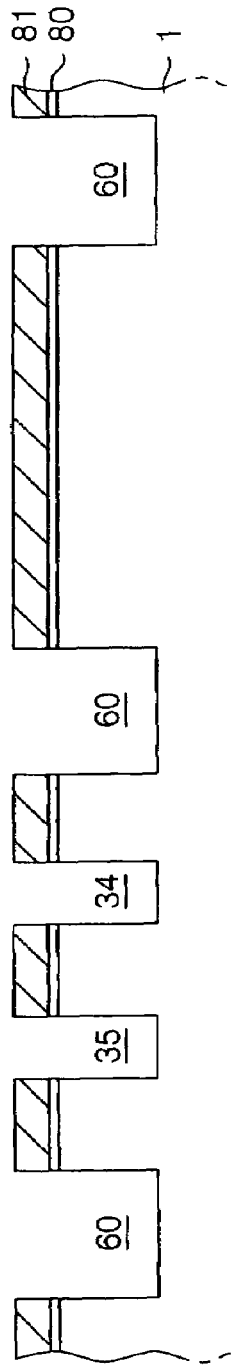

In the process, a thermal oxidation film 80 and a silicon nitride film 81 are first formed on a P-type semiconductor substrate, as shown in FIG. 2(a). Next, openings corresponding to the trenches 34 and 35 and the device partitioning trench 60 are formed in the silicon nitride film 81 using lithographic techniques. Then, the silicon nitride film 81 and the thermal oxidation film 80 are masked, and the trenches 34 and 35 and device partitioning trench 60 are formed by etching the semiconductor substrate 1, as shown in FIG. 2(b). The depth of the trenches 34 and 35 may be, for example, 0.05 to 0.45 μm, and the width may be, for example, 0.3 to 3.0 μm.

In the process shown in FIG. 2(a) and FIG. 2(b), the trenches of the P channel high voltage transistor are formed at the same time. The processes shown in FIGS. 2(a) and 2(b) may be accomplished using the known shallow trench isolation (STI) technology.

Figure 2C:
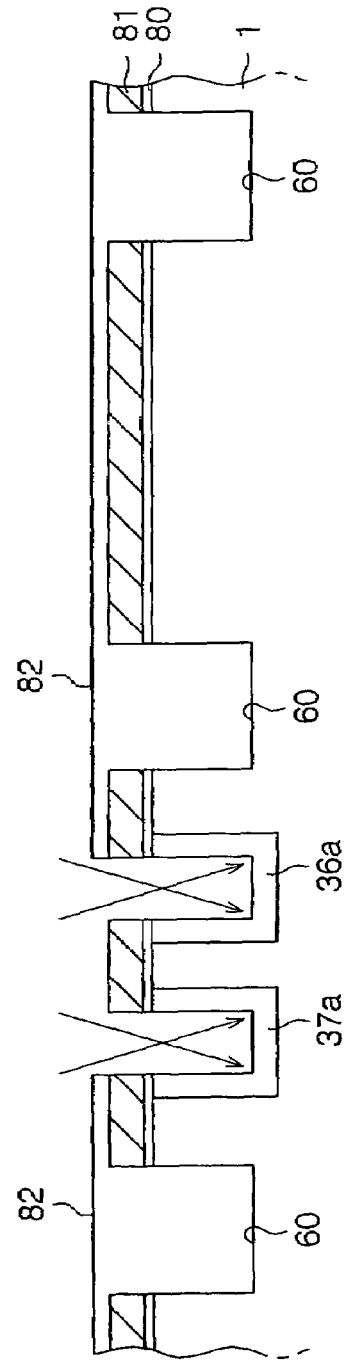

Thereafter, as shown in FIG. 2(c), a resist 82 masks the device partitioning trench 60. Then, an N-type conduction impurity is implanted through the openings of the trenches 34 and 35 in the semiconductor substrate 1 from diagonal directions to form the first sections 36a and 37a of the LDD regions 36 and 37. FIG. 2(c) shows an example of the impurity implanted into the trenches 34 and 35 of the N channel high voltage transistor UNT. In this case, the trenches used for the P channel high voltage transistor are masked by the resist 82. When implanting the impurity, the resist 82 is formed so as to have a shape matching the stepped widths of the LDD regions 36 and 37 as shown in FIG. 1(b).

Prior to or subsequent to the process of FIG. 2(c), a P-type conduction impurity is implanted in the openings of the semiconductor substrate 1 corresponding to the trenches used for the P channel high voltage transistor. When doing so, the N channel high voltage transistor is masked. This forms a first section, which is the section that extends along the trenches in the LDD region of the P channel high voltage transistor.

In this way, after forming the trenches 34 and 35 between the areas where the source region 31, the drain region 32, and the channel 33 are to be formed, the LDD regions 36 and 37 are formed by implanting the impurity in the semiconductor substrate 1 using these trenches 34 and 35.

Next, as shown in FIG. 3(a), a silicon oxide film 83 is deposited on the semiconductor substrate 1. It is preferred that the amount of the deposited silicon oxide film 83 be such that the height of the silicon oxide film 83 above the trenches 34 and 35 and the device partitioning trench 60 is at or above the top surface of the silicon nitride film 81.

Using the silicon nitride film 81 as a stopper, the silicon oxide film 83 is removed by chemical-mechanical polishing (CMP). Finally, the silicon nitride film 81 and the thermal oxidation film 80 are removed by etching, as shown in FIG. 3(b). In this way, the device insulating film 61 fills the device partitioning trench 60, and the insulation materials 34z and 35z respectively fill the trenches 34 and 35.

Then, the N-type deep well 50, the P wells 20 and 30, and the N wells 10 and 40 are formed, as shown in FIG. 3(b). When forming the N-type deep well 50, the areas corresponding to the P well 20 and N well 10 of the normal voltage transistor are masked before implanting the N-type conduction impurity. The P wells 20 and 30 and the N wells 10 and 40 are formed by masking areas that do not correspond to the wells and then implanting the associated conduction impurity in each well.

The shape of the LDD regions 36 and 37 shown in FIG. 1(b) prevents short circuiting between the ends of the LDD region 36 and the LDD region 37 due to misalignment of the masks in the processes of FIGS. 2(c) and FIG. 3(b).

Next, the gate insulating film of each transistor is formed, as shown in FIG. 3(c). This is accomplished, for example, by performing the following processes. (1) An insulating film having a predetermined thickness is formed on the semiconductor substrate. (2) After the area corresponding to the high voltage transistor is masked, from the insulating film formed in process (1), the insulating film corresponding to the area for forming the normal voltage transistor is removed. (3) An insulating film having a thickness corresponding to the gate insulating film 26 is formed on the semiconductor substrate 1. The predetermined thickness in process (1) is such that the total thickness of the insulating films formed in process (1) and process (3) are equal to the thickness of the gate insulating film 38.

After each gate insulating film is formed, the gate electrodes of the normal voltage transistors and the high voltage transistors, such as the gate electrodes 27 and 39, may be formed in a batch at the same time.

Figures 4A, 4B, 4C:
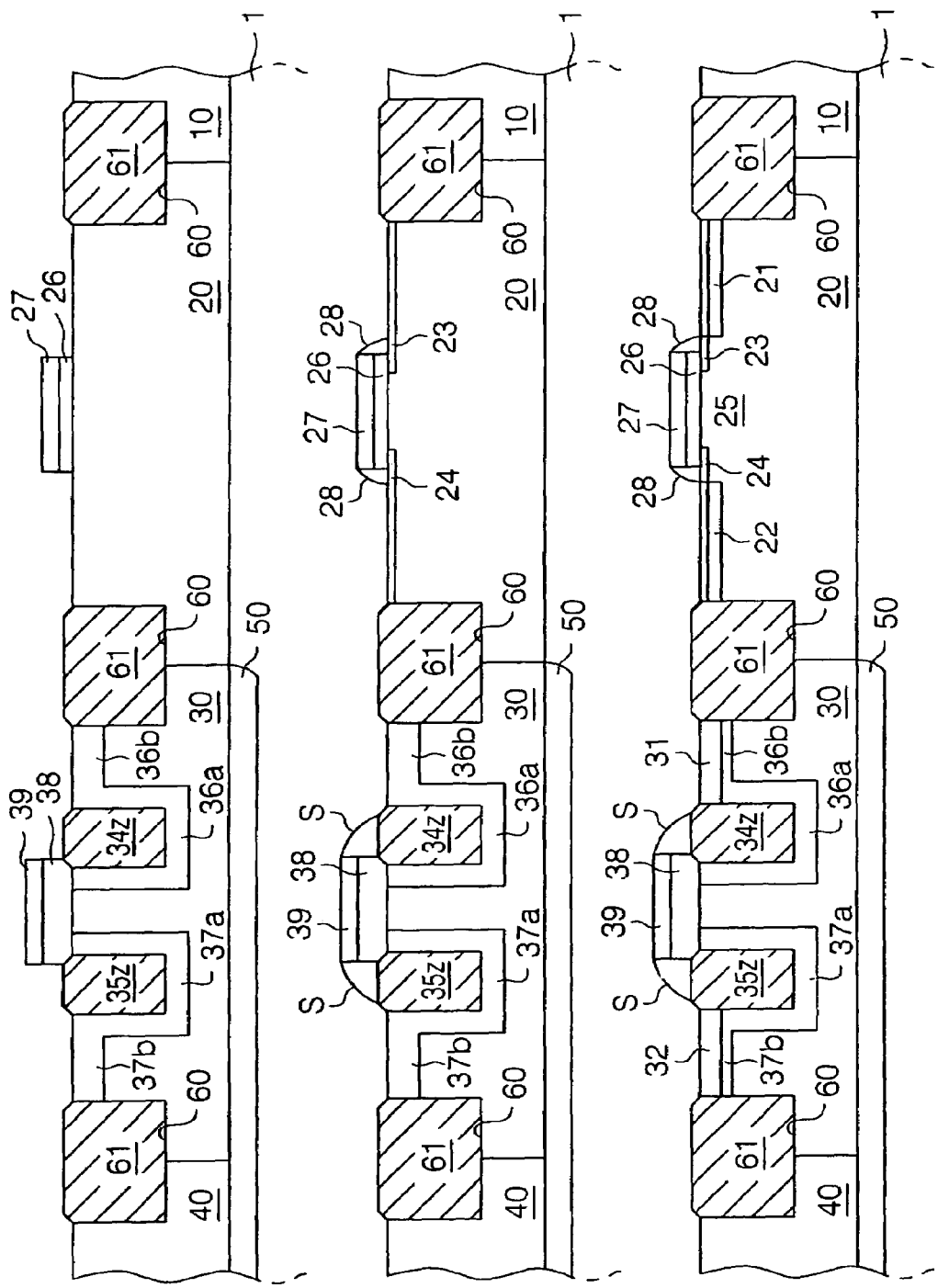
FIGS. 4(a), 4(b), and 4(c) are cross sectional views showing the manufacturing process for the semiconductor device of FIG. 1.

As shown in FIG. 4(a), the N wells 10 and 40 and the P well 20 are masked. Then, the second sections 36b and 37b are formed from the trenches 34 and 35 to the device insulating film 61 in the LDD regions 36 and 37 by implanting an N-type conduction impurity. Prior to or subsequent to the process of FIG. 4(a), the N well 10 and P wells 20 and 30 are masked, and a P-type conduction impurity is implanted to form the second section of the P channel high voltage transistor.

Then, an N-type or P-type impurity is implanted in a predetermined region of the normal voltage N channel transistor or P channel transistor to form the LDD region of the normal voltage transistor, as shown in FIG. 4(b).

After the LDD region of the normal voltage transistor has been formed, the spacers 28 of the normal voltage transistors and the spacers S the high voltage transistors are formed, as shown in FIG. 4(b). The spacers are formed, for example, by depositing a silicon oxide film on the semiconductor substrate 1 using a chemical vapor deposition (CVD) technique and then etching the deposited silicon oxide film by anisotropic etching.

Then, as shown in FIG. 4(c), the regions excluding the P wells 20 and 30 are masked and an N-type conduction impurity is implanted to form the source region 21 and drain region 22 of the N channel normal voltage transistor LNT and the source region 31 and drain region 32 of the N channel high voltage transistor UNT in a batch. Prior to or subsequent to the process shown in FIG. 4(c), the regions other than the N wells 10 and 40 are masked and the P-type conduction impurity is implanted to form the source regions and drain regions of the normal voltage and high voltage P channel transistors in a batch.

The first embodiment has the advantages described below.

(1) A trench filled with insulation material is formed between the source region and the drain region of the high voltage transistor, and an LDD region is formed along the trench from the channel to the source region and drain region along the trench. This maintains the voltage capacity between the source region and the drain region at a sufficient value during operation. Moreover, the connection of the LDD regions to the high concentration source region and drain region reduces the resistance. This, in turn, maintains the operating speed of the transistor at a sufficient value.

(2) The LDD regions and insulation material, such as the device insulating film 61, cover the interface of the source region and the drain region of the high voltage transistor. In this way, the junction voltage capacity of the source region and drain region of the high voltage transistors and the P well 30 and N well 40 is ensured in an optimal manner.

(3) The width of the LDD regions of the high voltage transistor is smaller at positions closer to the channel than positions closer to the source region and drain region. This provides a margin for misalignment of the photomask used to form the LDD regions. Furthermore, the mask pattern of the photomask used to form the LDD regions 36 and 37 is continuous and not separated between the LDD region 36 and LDD region 37, which are shown in FIG. 1(b). If the widths of the LDD regions 36 and 37 were uniform from the channel to the source region and the drain region, and the photomask were to be misaligned in the vertical direction of FIG. 1(b), the LDD region 36 and LDD region 37 may be connected to each other at a location beyond the end of the channel 33. This may cause short-circuiting between the source region and the drain region. However, in the first embodiment, the width at positions closer to the channel side is smaller. Thus, even if there was a slight misalignment of the photomask, the LDD region 36 and the LDD region 37 would not be connected to each other and there would thus be no short-circuiting between the source region and the drain region.

(4) The N-type deep well 50, which has a triple well configuration, includes the N well 40 and the P well 30, which form the high voltage transistor. This enables the operating voltage of the N channel high voltage transistor to be set separately for each P well. Furthermore, noise is prevented from entering the high voltage transistor from the normal voltage transistor.

(5) After trenches are formed between the region for the channels and the region for the source and drain of the high voltage transistor, the LDD regions are formed along the trenches by implanting an impurity through the opening of the trenches in the same semiconductor substrate. This facilitates alignment of the LDD region with respect to the trenches and enables the LDD region to be formed accurately. Therefore, the LDD region is not significantly misaligned from the correct position before the positioning of a gate electrode. This facilitates the alignment of the gate electrode and the LDD region. Thus, a margin for the gate electrode to absorb misalignment of the gate electrode and the LDD region may be minimized. This enables miniaturization of the semiconductor device.

(6) The device partitioning trench 60 and the channels of the high voltage transistor are formed at the same time. This simplifies the manufacturing process.

(7) The manufacturing process may further be simplified by filling the insulation material in the trenches and filling the device insulating film 61 in the device partitioning trench 60 at the same time.

A semiconductor device according second embodiment of the present invention will now be described with reference to the drawings focusing on points differing from the first embodiment.

Figure 5:
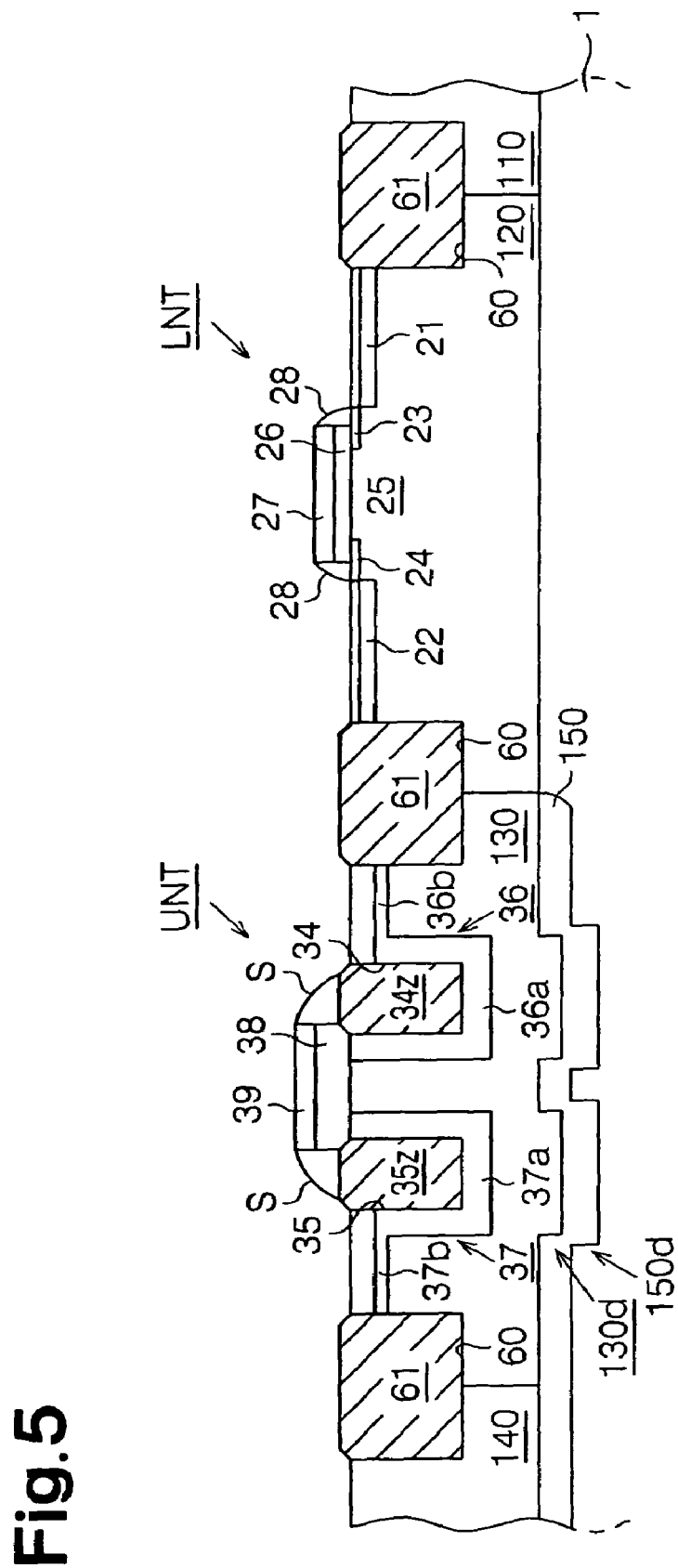
FIG. 5 is a cross sectional view showing the structure of a semiconductor device according to a second embodiment of the present invention.

The cross sectional structure of the semiconductor device in the second embodiment is shown in FIG. 5. The semiconductor device of the second embodiment also includes a normal voltage transistor and a high voltage resistor, which has a higher voltage capacity than the normal voltage transistor. Furthermore, the normal voltage transistor and the high voltage transistor are complementary-type transistors (CMOS). Parts common to parts shown in FIG. 1 are labeled by identical reference numbers in FIG. 5.

The semiconductor device of the second embodiment also has a triple well configuration for forming the P channel and N channel normal voltage transistors and the P channel and N channel high voltage transistors. That is, the P-type semiconductor substrate 1 includes an N well 110 and P well 120, which form a normal voltage transistor, and a P well 130 and an N well 140, which form a high voltage transistor. Furthermore, an N-type deep well 150 having N-type conduction is formed so as to include the P well 130 and the N well 140 of the high voltage transistor.

The P well 130 and N-type deep well 150 respectively include steps 130d and 150d, which have increased depths from the surface of the semiconductor substrate 1 in the regions below the trenches 34 and 35.

The process for manufacturing the semiconductor device of the second embodiment will now be described with reference to FIG. 6.

Figure 6A:
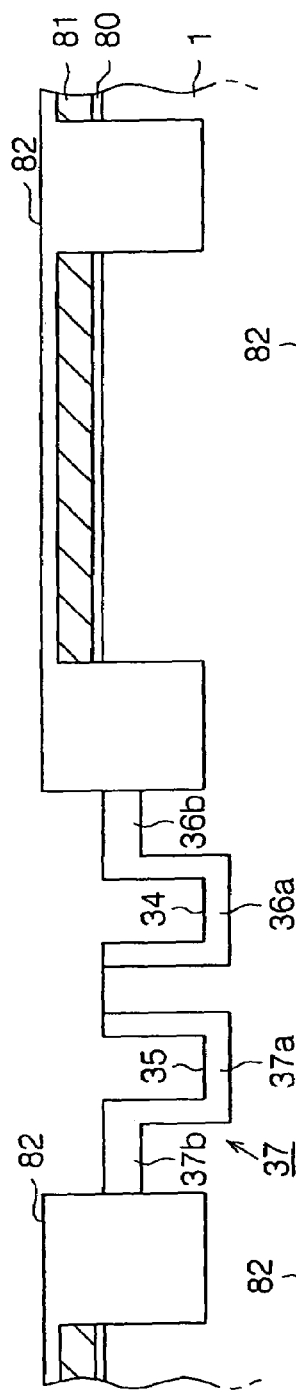
FIGS. 6(a), 6(b) and 6(c) are cross sectional views showing the manufacturing process for the semiconductor device of FIG. 5.
Figure 6B:
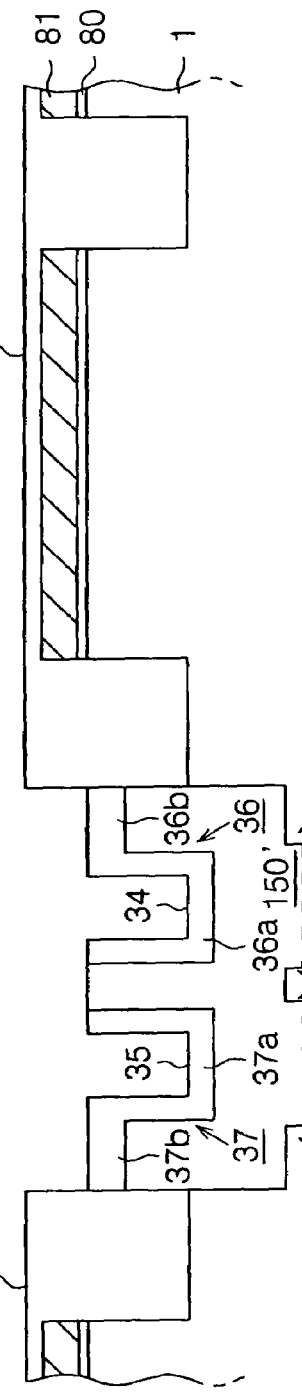

FIG. 6(a) shows a process that follows the process shown in FIG. 2(b). As shown in FIG. 6(b), after formation of the trenches 34 and 35 and the device partitioning trench 60, portions of the thermal oxidation film 80 and silicon nitride film 81 near the top of the trenches 34 and 35 in the semiconductor substrate 1 are removed. Then, the device partitioning trench 60 is masked by a resist 82, an N-type conduction impurity is implanted from diagonal directions through the opening of the trenches 34 and 35 in the semiconductor substrate 1 to form the LDD regions 36 and 37. FIG. 6(a) shows an example of a case in which the impurity is implanted into the trenches 34 and 35 of the N channel high voltage transistor UNT. In this state, the trenches of the P channel high voltage transistor are masked by the resist 82. When implanting the impurity, the resist 82 is formed to mask predetermined locations of the trenches 34 and 35 and form the LDD regions 36 and 37 so as to reduce the width of the channel, as shown in FIG. 1(*b*).

After the portions of the thermal oxidation film 80 and silicon nitride film 81 near the top of the openings of the trenches 34 and 35 in the semiconductor substrate 1 are removed, in addition to the first sections 36*a* and 37*a* of the LDD region 36, the second sections 36*b* and 37*b* are also formed simultaneously by implanting the impurity.

Figure 6C:
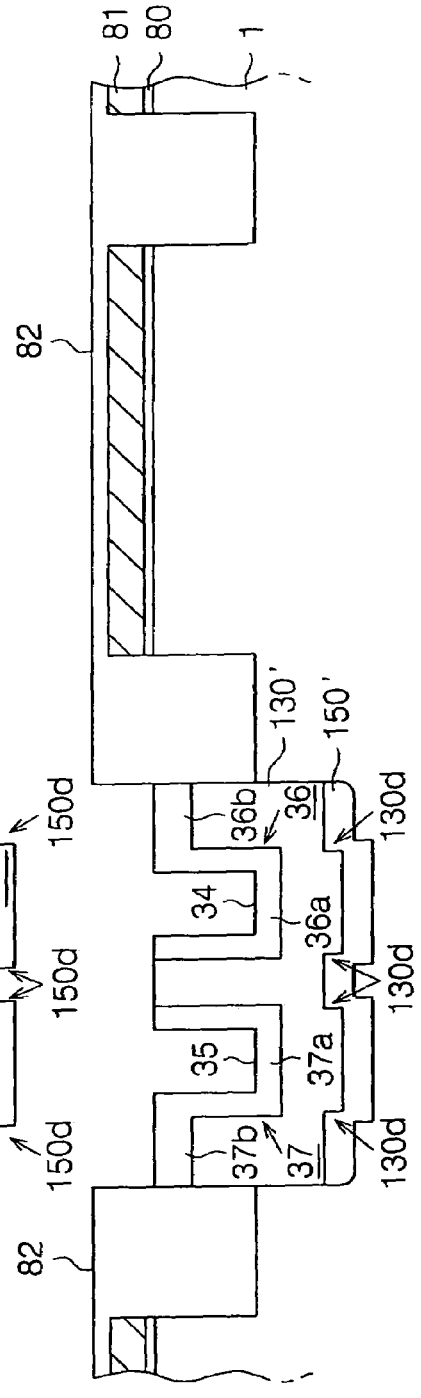

Then, referring to FIG. 6(*b*), with the resist 82, which is used for implanting the impurity to form the LDD regions 36 and 37, and the silicon nitride film 81 left in the same state, an N-type conduction impurity is implanted in the semiconductor substrate 1 to form a well 150', which is the original form of the N-type deep well 150. Thus, an N-type conductive type well 150' identical to the N-type deep well 150 is formed in the region of the semiconductor substrate 1 where the N channel high voltage transistor is formed. The well 150' has a step 150*d* having an increased depth from the surface of the semiconductor substrate 1 in the region below the trenches 34 and 35.

Then, referring to FIG. 6(*c*), with the resist 82, which is used for implanting the impurity to form the LDD regions 36 and 37, and the silicon nitride film 81 left in the same state, a P-type conduction impurity is implanted in the semiconductor substrate 1 to form a well 130', which is the original form of the P well 130. Thus, a P-type conductive well 150' identical to the well 130' is formed in the region of the semiconductor substrate 1 where the N channel high voltage transistor is formed. The well 130' has a step 130*d* having an increased depth from the surface of the semiconductor substrate 1 in the region below the trenches 34 and 35.

Although not shown in the drawings, processes similar to the processes shown in FIGS. 6(*a*) through 6(*c*) are performed in the region in which the P channel high voltage transistor is formed prior to the process of FIG. 6(*a*) or subsequent to the process of FIG. 6(*c*). A step need not be formed in the well of the P channel high voltage transistor. That is, the P channel high voltage transistor has an N-type well formed in the surface region of a P-type semiconductor substrate 1. A further N-type well is formed in the N-type well. Therefore, in a P channel high voltage transistor, the depth of the N well is ensured in the region below the trench.

In addition to advantages (1) through (7), the second embodiment has the advantages describe below.

(8) The P well 130 and the N-type deep well 150 each have a step that increases the depth from the surface of the semiconductor substrate 1 in the region below the channels. This ensures sufficient distances between the LDD region and the P well 130 and between the LDD region and the N-type deep well 150. Thus, latch-up and the like are avoided.

(9) After portions of the thermal oxidation film 80 and the silicon nitride film 81 near the top of the openings of the trenches 34 and 35 in the semiconductor substrate 1 are removed, in addition to the first sections 36*a* and 37*a* of the LDD region 36, the second sections 36*b* and 37*b* are formed simultaneously by implanting the impurity.

It should be apparent to those skilled in the art that the present invention may be embodied in many other specific forms without departing from the spirit or scope of the invention. Particularly, it should be understood that the invention may be embodied in the following forms.

In the second embodiment, the implanting of an impurity to form the LDD regions 36 and 37 does not necessarily have to be performed after removing portions of the thermal oxidation film 80 and the silicon nitride film 81 near the top of the openings of the trenches 34 and 35 in the semiconductor substrate 1. Even in such a case, the above advantage (8) is obtained by forming the P well 130 and the N-type deep well 150 with a step that increases the depth from the surface of the semiconductor substrate 1 in the region below the trenches.

In the second embodiment, the P well 130 and the N-type deep well 150 need not necessarily be formed to have a step that increases the depth from the surface of the semiconductor substrate 1 in the region below the channels. Even in such a case, the processes for forming the LDD regions 36 and 37 may be reduced by implanting the impurity after the portions of the thermal oxidation film 80 and silicon nitride film 81 near the openings the trenches 34 and 35 in the semiconductor substrate 1 are removed.

The voltage capacity between the source region and the drain region is ensured by forming an LDD region along a trench even if the ends of the source region and the drain region are not covered by at least one of the trench and the device insulating film. Moreover, the resistance of the transistor is suppressed by connecting the LDD region with the source region and the drain region.

The trenches used for forming the high voltage transistors need not be formed in the same process as the device partitioning trench.

The depth of the trench for forming the high voltage transistor and the depth of the device partitioning trench need not necessarily be the same.

The structure of the high voltage transistor may be modified if necessary so long as it has a structure forming the LDD region (low concentration diffusion region) along a trench. For example, the silicide structure and spacer S may be eliminated. In such a case, trenches need not necessarily be formed on opposite sides of the channel 33 and may be formed only near the drain region to which voltage greater than the source region is applied. In this case, the source region and the corresponding LDD region have a structure identical to the source region and LDD region of the normal voltage transistor.

The time of forming each well, such as the N-type deep well, is not limited to the examples in the embodiments. For example, the formation of the N-type deep well may precede the formation of the trenches.

The semiconductor device does not necessarily have to have a complementary type (CMOS) structure and triple well configuration. Furthermore, the semiconductor device does not necessarily have to have a plurality of transistors having different characteristics. As long as there is a high voltage transistor in each of the above embodiments and modifications thereof, the transistor capacity, such as the voltage capacity, may be maintained as desired while reducing the transistor resistance in an optimal manner.

In the above embodiments, wells are formed in a P-type substrate. However, the wells may be formed in an N-type substrate. In such a case, a P-type deep well is used as the deep wall 50.

The present examples and embodiments are to be considered as illustrative and not restrictive and the invention is not to be limited to the details given herein, but may be modified within the scope and equivalence of the appended claims.

What is claimed is:

1. A semiconductor device comprising:
a semiconductor substrate including a main surface;
a source region and a drain region formed on the main surface of the semiconductor substrate and spaced from each other by a predetermined interval;
a gate electrode formed on the semiconductor substrate;
a trench filled with insulation material and formed with a predetermined depth in the main surface of the semiconductor substrate between a location under the gate electrode and at least one of the source region and the drain region, wherein the trench extends under at least one of the source region and the drain region, wherein the trench has opposite side wall surfaces and a bottom surface; and
an LDD formed along the trench and having an impurity concentration that is lower than that of the source region and the drain region, wherein the LDD extends along the opposite side wall surfaces and the bottom surface of the trench.

2. The semiconductor device of claim 1, wherein the LDD includes opposite ends and extends from a surface of the trench to a region below at least one of the source region and drain region, with one end of the LDD arranged in a region below at least one of the source region and the drain region contacting the trench, and the other end contacting a device partitioning region.

3. The semiconductor device of claim 1, wherein the LDD region has a width that decreases near the location under the gate electrode.

4. The semiconductor device of claim 1, further comprising:
a first well formed on the main surface of the semiconductor substrate; and
a second well formed in the first well so as to be deeper than the trench.

5. The semiconductor device of claim 4, wherein the first well and the second well each have a step that increases the depth of each well from the main surface of the semiconductor substrate in the region below the trench.

* * * * *